United States Patent [19]

Fang et al.

[11] Patent Number: 5,181,179
[45] Date of Patent: Jan. 19, 1993

[54] ARTIFICIAL PARAMETER HOMOTOPY METHODS FOR THE DC OPERATING POINT PROBLEM

[75] Inventors: San-Chin Fang, New Providence; Robert C. Melville, Scotch Plains; Ljiljana Trajkovi, Chatham, all of N.J.

[73] Assignee: AT&T Bell Laboratories, Murray Hill, N.J.

[21] Appl. No.: 557,874

[22] Filed: Jul. 25, 1990

[51] Int. Cl.$^5$ .................. G06F 15/72; G06F 15/20
[52] U.S. Cl. .................... 364/488; 364/578
[58] Field of Search ........... 364/488, 489, 553, 578; 324/158 T, 73 R, 73 PC

[56] References Cited

U.S. PATENT DOCUMENTS

| | | | |
|---|---|---|---|
| 4,817,012 | 3/1989 | Cali | 324/158 T |
| 5,014,230 | 5/1991 | Sinha et al. | 364/578 |
| 5,047,971 | 9/1991 | Horwitz | 364/578 |

OTHER PUBLICATIONS

"Finding Zeroes of Maps: Homotopy Methods That Are Constructive With Probability One*", by Shui-Nee Chow, John Mellet-Paret and James A. Yorke, Mathematics of Computation, vol. 32, No. 143, Jul. 1978, pp. 887-899.
"Steady-State Methods for Simulating Analog and Microwave Circuits", by Kenneth S. Kundert, Jacob K. White and A. Sangiovanni-Vincentelli, Appendix C Arc-Length Continuation, pp. 221-226, 1990.
"Circuit Simulation and Modeling", by Ping Yang, IEEE Circuits and Devices Magazine, pp. 48-49, Sep. 1989.
"Engineering Applications of the Chow-Yorke Algorithm*", by Layne T. Watson, Applied Mathematics and Computation, pp. 111-133, 1981.
"Correspondence—Solving SPICE Problems", by R. D. Castro, Jan. 18, 1988.
"Existence Theorems and a Solution Algorithm for Piecewise-Linear Resistor Networks*", by T. Ohtsuki, T. Fujisawa and S. Kumagai, Siam J. Math. Anal., vol. 8, No. 1, Feb. 1977.

Primary Examiner—Thomas G. Black
Assistant Examiner—Ellis B. Ramirez
Attorney, Agent, or Firm—Henry T. Brendzel

[57] ABSTRACT

A new class of circuit simulation methods comprises a homotopy that is constructed by employing particular models of the nonlinear elements of the circuit and by including a randomizing component in the homotopy equation. In particular, the models of the non-linear elements are passive, in the sense that they contain no negative resistors and no voltage dependent sources. Also, the models are smooth enough to at least have well-defined first and second order derivatives. One such homotopy is $(1-t)(Bx+a)+tF(x)=0$, where B is a randomizing matrix and a is a randomizing vector, t is the continuation parameter, x is a vector of the circuit's node voltages, and F(x) is a set of equations such that $F(x)=0$ describes the circuit. Another is the homotopy $(1-t)(F_A(x)+a)+tF_B(x)+\sigma(t)(x-a)$ where $F_B(x)=0$ describes the circuit whose dc operating point is sought, $F_A(x)=0$ describes a circuit whose dc operating point is known, and $\sigma(t)$ is a function that is 0 at $t=0$ and $t=1$. The randomizing portion reduces the chances of a bifurcation occurring in the course of analysis to essentially zero.

21 Claims, 2 Drawing Sheets

ARTIFICIAL PARAMETER HOMOTOPY METHODS FOR THE DC OPERATING POINT PROBLEM

BACKGROUND OF THE INVENTION

This invention relates to circuit simulation, and more particularly to simulations for determining the dc operating point of circuit designs.

A large number of integrated circuits are routinely designed which contain hundreds, and even thousands of transistors. Such designs must be verified before fabrication because the fabricated circuits cannot be tested in all but a few predesignated points within the circuits (typically, only by observing the behavior of output signals). Also, the economic consequences of errors in such circuits are very significant. In analog circuits in particular, a determinations of the dc operating point (i.e. the dc operating points of all nodes in the circuit) is important because it is essential for the devices to not be driven into saturation. The dc operating point is also important for the evaluation of the circuit's dynamic response in both analog and digital circuits.

Speedy computation of the dc operating point of a semiconductor circuit has been a difficult problem since the early days of circuit simulation. With many circuits—primarily analog—engineers spend large amounts of time "fighting" a simulator to obtain the dc operating point of their circuit. In some cases, the difficulty of obtaining a dc operating point indicates that something is wrong with the circuit and suggests that a re-design is needed. In other cases, however, the difficulty is simply an artifact of the algorithm that is used to find an operating point.

One method for determining the dc operating point of a circuit is known as Newton's method, and it dates back to Newton's basic mathematical work dealing with the problem of finding x for the relationship $y(x)=0$, where $y(x)$ is a non-linear function. When the value of $y(x)$ is known for a particular x, the Newton method proceeds iteratively to find the x that yields $y(x)=0$. The Newton method comprises iterating between basically two steps. First, the slope of $y(x)$ is determined at the known $y(x)$ and a line is constructed at the known slope which contains the point $y(x)$ and which intersects the x axis at a point x' (assuming that the slope at $y(x)$ is non-zero). Second, the value of $y(x')$ is evaluated. Of course, the above describes a two dimensional situation; but the extension to multi-dimensional space is straight forward.

It can be shown that for some problems the iterated solutions in Newton's method will not converge to a final solution. It can also be shown, fortunately, that when the initial known point is within a certain region of the true solution, then the Newton method will converge quickly to the true solution. This certain region is called the region of convergence.

In connection with the problem of determining the dc operating point of a circuit, the Kirchoff current equations of a circuit have the form of the Newton method (the sum of currents flowing into a node is 0), where the semiconductor devices contribute non-linear terms to the sum. The Newton procedure can be applied to the task at hand, but the problem with the Newton method is that the region of convergence is a function of the nonlinearities in the circuit, and that region is not always very large. Also, the location of that region in the space of the unknowns is not known a priori.

Variations of Newton's method have been proposed which have a wider domain of convergence. One such variation is commonly referred to as the damped Newton method. The damped Newton method is the same as the Newton method, except that at each iteration, the value of $y(x')$ is compared to the value of $y(x)$. When $y(x')$ is larger in magnitude than $y(x)$, a modifying step is introduced whereby a different x value (x") is selected, which lies between x and x' and which results in a $y(x")$ that is smaller in magnitude than $y(x)$. While the damped Newton method is superior to the undamped Newton method in some respects, it still has the same failure modes. Indeed, the damped Newton method has the additional failure mode of tending to settle the circuit simulation at a local minimum, which is not a solution of the circuit's dc operating point.

Another approach to the dc operating point problem is known as source stepping. It begins by setting all supply voltages to zero. At that point the circuit has an obvious operating point (the voltages at all nodes are zero). Next, the independent sources are gradually increased from zero to their final values, and at each increment the operating point is evaluated. The operating point at each new increment is evaluated by observing that when the increments are fine enough, the operating point at the previous level of voltages is a close approximation to the operating point at the current level of voltages. To find the exact operating point, an iterative procedure (such as Newton's method) can be used to correct the operating point approximations. Viewed from a different perspective, at each step, the voltages of the nodes are known approximately and it is, therefore, safe to assume that the approximate voltages are within Newton's region of convergence and, hence, Newton's method may be used with relative confidence that the procedure will converge.

Mathematically, the process of slowly incrementing the supply voltage may be described by a system of equations $$F_1(x_1, \ldots, x_n, t) = 0$$
$$F_2(x_1, \ldots, x_n, t) = 0$$
$$\vdots$$
$$F_n(x_1, \ldots, x_n, t) = 0$$

where a control parameter t, which is a real number between 0 and 1, multiplies the value of each of the independent sources. If the above system of equations is abbreviated as $F(x,t)=0$, then $F(x,0)=0$ represents the circuit with all supplies turned off, and $F(x,1)=0$ represents the original circuit whose operating point is desired. Viewing each node voltage as a function of t, there is a trajectory of dc operating points $x(t)=(x_1(t), \ldots, x_n(t))$ as t sweeps from 0 to 1.

To determine the operating point at $F(x,t_i+\delta)$ when the operating point at $F(x,t_i)$ is known, conventional techniques may be employed that basically develop a measure of the rate of change in the dc operating point with respect to the dc operating point at $t_i$ and with respect to $t_i$.

Unfortunately, the source stepping procedure is not always robust. If the circuit has multiple operating points, then for some critical value of t the solution trajectory will attempt to split, or bifurcate. Such bifurcations cause numerical problems (since there is no well-defined derivative with respect to t at the point of bifurcation). It may be noted, as an aside, that this condition is not unusual. Indeed, a circuit may even have a unique operating point at the final value of all the supplies, and still have multiple operating points at intermediate values of the supplies. In such a case, the success or failure of the source stepping procedure will be sensitive to the relative rate at which the various sources are turned on.

Another stepping technique is known as GMIN stepping. In this technique, artificial conductances are inserted between each node and ground and a global parameter—GMIN—sets the value of these conductances. Initially, GMIN is set to a very large value, which effectively "shorts" each node to ground. In a way, this condition is akin to dropping all voltages to zero and, typically, a dc solution is obtained easily at this point. Then GMIN is reduced in steps, using the operating point from the previous value of GMIN as a starting point for the iterative solution at the next value of GMIN. Again, the approximations at each step may be replaced with corrected values with the aid of the Newton method.

This method is indeed very similar to the source stepping method and it has the same difficulty with potential bifurcations in the solution trajectory. This potential exists with GMIN stepping because there is only a single degree of freedom in the system; i.e., the value of GMIN. Also, this method allows GMIN to only decrease which, in some circumstances, makes it impossible to advance along the above-described trajectory.

The above-described source stepping and GMIN stepping methods are sometimes described as homotopy or continuation methods. The homotopy approach involves forming a simplified version of the circuit whose operating point is needed, finding an operating point of this easier circuit, then "sweeping" some quantity to generate a trajectory of solutions that leads to the operating point of the original circuit.

Once the operating point problem has been formulated as the solution for a system of nonlinear equations, the intuitive idea of sweeping can be made mathematically precise, and numerical algorithms have been developed to follow the solution trajectories. Indeed, software packages are readily available for carrying out the numerical calculations involved, such as the package called PITCON (from the University of Pittsburgh).

In short, the art of circuit evaluations to determine the dc operating point has progressed to the point of using number of homotopy techniques, but a number of important drawbacks still force the skilled designers to experiment with circuit parameter modifications whenever the simulations ran into computation problems.

SUMMARY OF THE INVENTION

The drawbacks of prior art methods are overcome with a new class of circuit simulation methods. In the new class of methods, a homotopy is constructed by employing particular models of the nonlinear elements of the circuit and by including a randomizing component in the homotopy equation. In particular, the models of the non-linear elements are passive, in the sense that they contain no negative resistors and no voltage dependent sources. Also, the models are smooth enough to at least have well-defined first and second order derivatives. A number of examples are given of homotopies that include a randomizing portion.

One, for example, is the homotopy $(1-t)(Bx+a)+tF(x)=0$, where B is a randomizing matrix and a is a randomizing vector, t is the continuation parameter, x is a vector of the circuit's node voltages, and $F(x)$ is a set of equations such that $F(x)=0$ decribes the circuit. Another example is the homotopy $(1-t)(F_A(x)+a)+tF_B(x)+\sigma(t)(x-a)$ where $F_B(x)=0$ describes the circuit whose dc operating point is sought, $F_A(x)=0$ describes a circuit whose dc operating point is known, and $\sigma(t)$ is a function that is 0 at $t=0$ and at $t=1$. The randomizing portion reduces the chances of a bifurcation occurring in the course of analysis to essentially zero.

DETAILED DESCRIPTION

Figure 1:
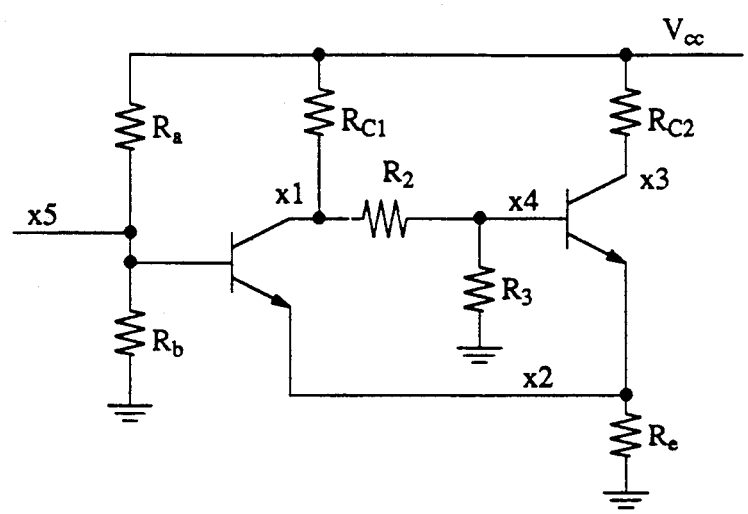
FIG. 1 depicts a Schmitt trigger.

About 20 years ago, Chow, Mallet-Paret and Yorke published an article titled "Finding Zeros of Maps: Homotopy Methods That Are Constructive With Probability One", *Mathematics of Computation*, Vol. 32, No. 143, pp. 887-899. Noting that Degree Theory is generally used to prove existence of solutions, they addressed the issue of proving the existence of constructive (or implementable) solutions, even if only in a somewhat restrictive sense. They presented mathematical proofs, based on a transversality theorem, of constructive solution methods for a number of problems, such as 1. finding the Brouwer Fixed Point;
2. finding zeros of maps of $R^n$ into $R^n$, under various hypotheses;
3. finding solutions of two point boundary problems for second order differential equations in $R^n$; and
4. finding zeros for a vector field on $S^n$, where n is even.

Their basic idea was to consider the homotopy $$\phi_a(\lambda,x)=(1-\lambda)g_a(x)+\lambda f(x) \quad 0\leq\lambda\leq 1 \quad (1)$$

and use the general "Sard" theorems to obtain a guarantee that for almost every a, $\phi_a^{-1}(0)$ contains a smooth curve $\Gamma_a$ which will lead from a zero of $g_a$ to a zero of f.

Although they derived the necessary proofs, the application of their work to practical problems was not realized. To quote the article itself, "while we may think of the Brouwer Fixed Point Theorem as being a basic tool in problems of applied mathematics, surprisingly few mathematical applications outside mathematical economics have been found for the constructive methods first introduced by Scarf". Id. at pg. 890.

We recognized that the mathematical proofs developed by Chow et al. can be applied in the context of circuit simulations for the purpose of determining the circuit's dc operating point. When applied to a circuit simulation problem, or more specifically to the solution of the dc operating point of a circuit, the homotopy method presented by Chow et al. would best be described as an artificial parameter homotopy method. That is to say, the quantity that would be "swept" does not have any obvious physical interpretation, as contrasted, for example, with sweeping supply voltage, which can be considered to be a natural parameter homotopy.

In translating, or "customizing", the Chow et al. work to the circuit simulation environment, we have concluded that what Chow et al. have done is treat the mathematical problem represented by a system of nonlinear equations $F(x)=0$, where $F:R^n \rightarrow R^n$. Their conclusion was that if F satisfies the inner-product condition $F(x)^T x \geq 0$ for all x such that $\|x\|_2 \leq r$, where r is a fixed positive number, then $F(x)=0$ has a solution $x^*$ within that region of x. In the above, $\|-\|_2$ denotes the Euclidean 2-norm, and $F(x)^T x$ is the inner product of $F(x)$ with x.

When translated to the circuit simulation environment, the various conditions accepted by Chow et al. turn into two requirements of the function F.

The first requirement is passivity, which is a consequence of the inner-product condition. It reflects the idea that the device does not deliver more energy than it receives. In practice, that means that the circuit cannot contain negative resistors, or voltage dependent voltage sources. In accordance with our invention, such non-passive elements are accommodated by introducing an appropriate notion of "limiting" into the device model. This requirement actually results in a more faithful model of the device (heretofore, artisans sacrificed authenticity for simplicity in the model). In accordance with the principles of our invention, circuits may therefore include all practical nonlinear devices, such as exponential and tunnel diodes, MOSFET's, etc., but no non-passive elements.

The second requirement is that the device models which are used within F must be smooth enough to at least have well defined first and second order derivatives.

In light of the requirements imposed on F, one dc operating point simulation homotopy can clearly be the homotopy studied by Chow et al., to wit:

$$H_a(x,t) = tF(x) + (1-t)(x-a) \quad (2)$$

where $a = (a_1, \ldots, a_n)$ is a fixed element of $R^n$, i.e., a is a vector of real numbers. It is easily seen that a solution of $H_a(x,0)=0$ is trivial ($x=a$), and that a solution of $H_a(x,1)=0$ is also a solution of $F(x)$. Following the homotopy paradigm, the easy problem, "solve $(x-a)=0$", is deformed in a continuous manner into the desired problem "solve $F(x)=0$".

In accordance with the theory developed by Chow et al. and with the above two requirements imposed, almost all choices of a with $\|a\| \leq r$ offer a solution trajectory for $F_a(x,t)=0$ that is a smooth path (as t is swept) which terminates in a zero of F; i.e., $F(x^*)=0$. The value of r is the largest supply voltage in the circuit.

Unlike the prior art techniques for determining a circuit's operating point, our method includes the vector a, which provides an element of random choice in the procedure for finding a zero of F. Each different choice of a provides a different possible path to a zero of F; and "most" such paths are successful. It can be shown that the set of bad choices of a has measure zero, and therefore a random choice of a has zero probability of hitting a bad choice. In this sense, the algorithm for finding a zero of F is globally convergent. Of course, a computer implementation has only a finite approximation of real numbers, so there is no such thing as a set of measure zero. Nonetheless, actual experiments with the above method indicate exceptionally robust convergence when the device models are reasonably smooth.

The above-described homotopy is not a natural parameter homotopy, but it does have an interesting physical interpretation. In particular, imagine connecting a resistor in series with a voltage source between each node of the circuit and ground. The value of the voltage source attached to node k is $a_k$, and the value of all such resistors is $t/(1-t)$. The nodal equation for a node k in such a circuit is:

$$\sum_{j=1}^{m} I_j = \frac{(1-t)}{t}(a_k - x_k) \quad (3)$$

in which there are m branches connected to node k in the original circuit, carrying currents $I_1, \ldots, I_m$. Recognizing that the current summation on the left-hand side of the above equation is $F_k(x)$ as previously defined, we see that equation (3) is equivalent to equation (2) above.

Figure 2:
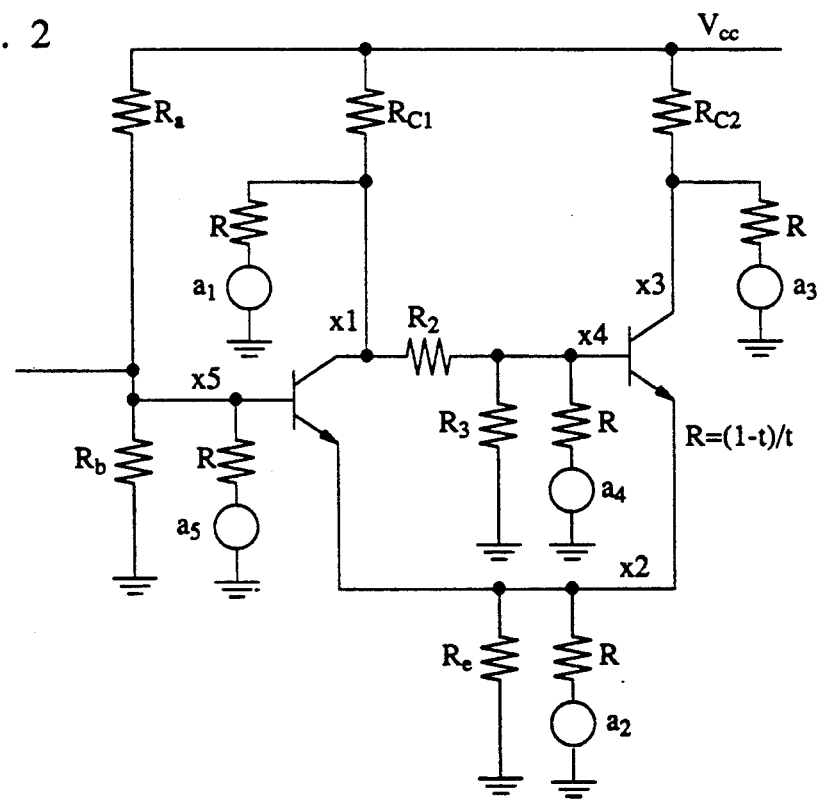
FIG. 2 depicts the circuit of FIG. 1 that is augmented to correspond to a homotopy with a randomizing portion.

To illustrate the physical interpretations, FIG. 1 shows a conventional Schmitt trigger circuit, and FIG. 2 shows the FIG. 1 Schmitt trigger with the homotopy of equation (2), with the subscripts on the variables corresponding to the node numbering in FIG. 1. By convention, all semiconductor currents flow into a device, so a term like $i_{c2}$ denotes the current flowing into the collector of transistor Q2. The following presents the Kirchoff current equations for the circuit of FIG. 1.

$$F_1(x_1, \ldots, x_5) = \frac{x_1 - V_{cc}}{R_{c1}} + \frac{x_1 - x_4}{R_2} + i_{c1} = 0$$

$$F_2(x_1, \ldots, x_5) = \frac{x_2}{R_e} + i_{e1} + i_{e2} = 0$$

$$F_3(x_1, \ldots, x_5) = \frac{x_3 - V_{cc}}{R_{c2}} + i_{c2} = 0$$

$$F_4(x_1, \ldots, x_5) = \frac{x_4 - x_1}{R_2} + \frac{x_4}{R_3} + i_{b2} = 0.$$

$$F_5(x_1, \ldots, x_5) = \frac{x_5 - V_{cc}}{R_a} + \frac{x_5}{R_b} + i_{b1} = 0.$$

For the circuit of FIG. 2, the above equations, which can be written as $F(x)=0$, are augmented to include the homotopy parameter and randomization vector as follows:

$$tF(x) + (1-t)(x-a) = 0. \quad (4)$$

As an aside, our physical interpretation of the equation (2) homotopy clearly demonstrates why the circuit is bifurcation free for almost all choices of the a vector. Consider a flip-flop with transistors Q1 and Q2. The operating point equations for this circuit have three distinct solutions, corresponding to Q1 "on" and Q2 "off", Q2 "on" and Q1 "off", or both transistors "on". An attempt to find an operating point of the flip-flop by stepping up the supply voltage must hit a bifurcation because whereas the circuit has a single, unique, operating point when the supply is 0, it has three distinct operating points at higher values of the supply. Since the solution path is only one dimensional, it must bifurcate at some critical value of the supply voltage. In contradistinction, when a resistor and voltage source combination is connected to the two collector nodes (per equation 3), a bifurcation can occur only when $a_1 = a_2$. Any other pair of starting values for $a_1$ and $a_2$ will deterministically steer the circuit to one of the three final states. Given a random choice of $a_1$ and $a_2$, the probability of choosing $a_1 = a_2$ is basically zero. In practice, such pathological cases can easily be circumvented.

Although the homotopy represented by equation (2) eliminates bifurcations with probability 1 and experiments show that it converges robustly, the convergence can be speed up. A speeded-up version is realized with the homotopy equation $$H_a(x,t) = F(tx) + (1-t)(x-a). \quad (5)$$

The physical interpretation provides some insight into what is happening. Suppose node k has a small-signal impedance of 1 megohm at the operating point of the circuit. The homotopy of equation (2) connects a resistor and a voltage source between this node and ground. Before the homotopy resistor is "out of the circuit" is should have a value at least 10 times as large as the natural impedance of the node to which it is connected. This means close to 10 megohms for node k. However $t/(1-t)$ is equal to $10^7$ only for t that is exceedingly close to 1.

The homotopy of equation (2) starts with the "simple" circuit where the dc operating point of each node is predefined by the randomizing constant vector a. A similar randomization can be achieved by modifying the GMIN approach. That is, the GMIN approach can be modified in accordance with the principles of our invention by creating the homotopy $$H_a(x,t) = (1-t)(Bx + a) + tF(x) \quad (6)$$

where B is an arbitrary matrix which provides randomization, and a is a vector that provides randomization. Of course, either B or a can be omitted with impunity (but not both) because a randomization factor will still be supplied by the remaining term. As with the pair of equations (2) and (5), another homotopy can be employed that is similar to that of equation (6) and that is $$H_a(x,t) = (1-t)(Bx + a) + F(tx) \quad (7)$$

Another approach for creating a "simple" circuit is to "linearize" all of the non-linear elements therein. That is, the approach is to introduce a control parameter, t, which removes all non-linearities from the equivalent circuits of the non-linear devices when it takes on the value 0. As it sweeps toward the value 1, the non-linearities are slowly reintroduced.

In the case of a transistor, for example, the collector and emitter currents depend on the transistor's base to emitter voltage and base to collector voltage in a nonlinear manner. Hence, the model for the emitter current can be expressed as $$i_e = f_1(x_b, x_e, x_c) + f_2(x_b, x_e, x_c) \quad (8)$$

where $f_1$ is the linear term in, say, the Taylor expansion of the nonlinear function that defines the current $i_e$, and $f_2$ comprises the higher order terms. The $f_1$ term can then be incorporated into the B matrix of equation (6).

Figure 3:
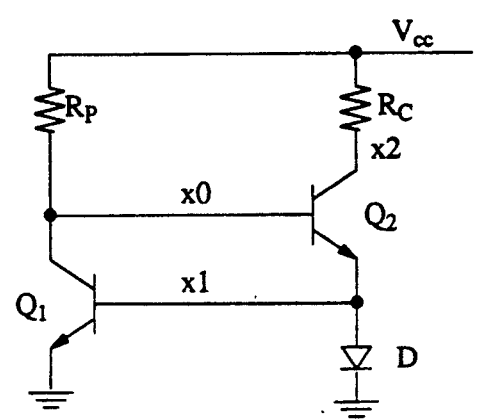
FIG. 3 illustrates a circuit that illustrates the variable stimulus homotopy.

Still another approach for creating a "simple" circuit is to essentially excise the nonlinear devices out of the circuit. We call this homotopy a variable stimulus homotopy. FIG. 3 presents an example with two transistors and a diode, and the operating point equations for that circuit are presented below. To explain the notation, the transistor model Q1 is stimulated by calling function Q1.stim with the node voltages for the collector and the base with respect to the emitter, (which is at 0 volts). Then, a function call like Q1.ic( ) delivers the collector current for the specified set of stimuli. (The two voltages for the diode are the voltages on the anode and cathode; D.ia( ) is the anode current flowing into D.)

Q1.stim(x[0],x[1],0)

Q2.stim(x[2],x[0],x[1])

D.stim(x[1],0)

$F[0] = Q2.ib( ) + Q1.ic( ) + ((x[0] - (V_{cc}))/R_p)$ $F[1] = D.ia( ) + Q2.ie( ) + Q1.ib( )$ $F[2] = Q2.ic( ) + ((x[2] - (V_{cc}))/R_L)$

To turn these equations into a homotopy where the nonlinear devices are excised from the circuit when $t = 0$, the above equations are rewritten as:

Q1.stim(t·x[0],t·x[1],0.0)

Q2.stim(t·x[2],t·x[0],t·x[1])

D.stim(t·x[1],0.0).

When $t = 0$, all semiconductors terminal currents, like Q2.ic( ) or D.ia( ) are zero, so the semiconductors are "out of the circuit." They slowly get "back into circuit" and a trajectory is generated by sweeping t from 0 to 1.

Actually, there is a problem with this homotopy at the very the beginning, where $t = 0$. At that point, no current flows into any transistor, so they might as well be disconnected. In the circuit of FIG. 3, this leaves node x1 floating, and that prevents the available computation algorithms from proceeding. This problem is circumvented by attaching artificial circuitry to each node. For example, in accordance with the homotopy of equation (2), one can attach a conductance of value $G = (1-t)/t$ in series with a voltage source of value $a_k$ between each node k and ground. As before, the voltage sources ($a_1, \ldots, a_n$) provide the random element needed to insure no bifurcations. The resulting equations for the FIG. 3 source are shown below:

Q1.stim(t·x[0],t·x[1],0.0)

Q2.stim(t·x[2],t·x[0],t·x[1])

D.stim(t·x[1],0.0)

$F[0] = (1-t)G \cdot (x[0] - a[0]) + Q2.ib( ) + Q1.ic( ) + ((x[0] - (V_{cc}))/R_p)$ $F[1] = (1-t)G \cdot (x[1] - a[1]) + D.ia( ) + Q2.ie( ) + Q1.ib( )$ $$F[2] = (1-t)G \cdot (x[2] - a[2]) + Q2.ic( ) + ((x[2] - V_{cc}))/R_L)$$

Figure 4:
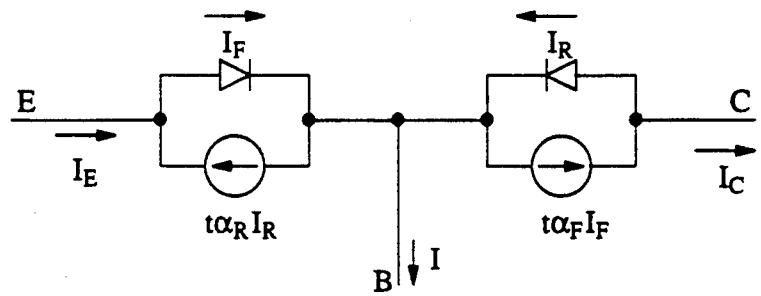
FIG. 4 illustrates a modification to the transistor's Ebers-Moll model to form a variable gain homotopy.

Yet another homotopy, which we call the variable gain homotopy, is particularly suitable to bipolar circuits. Therein, the transistor gain $\alpha$ is multiplied by the control parameter, t. FIG. 4 shows the conventional Ebers-Moll model for the homotopy-modified bipolar transistor, with forward current gain $t\alpha_F$ and reverse current gain $t\alpha_R$. Of course, when t=0 each transistor turns into a three terminal sub-circuit in which a diode is connected from base to collector and from base to emitter.

With this homotopy there is no problem with "floating" nodes, as with the variable stimulus homotopy. However, we still include the "leakage" circuitry to provide the random element needed to avoid bifurcations. At t=0, the simplified circuit is still non-linear (because the transistor models include diodes). However, the operating point equations for this circuit are such that the damped Newton procedure described above can be shown to be globally convergent.

The above-disclosed artificial parameter homotopies can be extended to the incremental problem. In such a problem, $F_A$ may be a circuit with parameters $p_1, \ldots, p_r$ which affect the dc operating point of the circuit—e.g., device sizes. When at a different set of parameters is presented for the same circuit, a different operating point results (say, $x_B$ rather then $x_A$). One way to view this is that $F_A$ is a different circuit than $F_B$. If the change in the parameters is not too drastic, then the two operating points should be "close" in the sense of a vector norm and then, perhaps, Newton's damped method may be applied. But even when $F_A$ is not "close" to $F_B$, philosophically there is little difference between the $F_A$ circuit as the starting point "simple" circuit, and the simplified circuit constructed in above description (e.g. in the homotopy of equation 2). In other words, $x = x_A$ may be a good starting point for developing $x_B$ and, indeed, our experience suggests that starting at $x_A$ rather than at some other "simple" circuit (x=a) results in a much quicker convergence to the ultimate $x_B$, because $x_A$ typically is much "closer" to $x_B$ than any contrived "simple" circuit. Thus, the homotopy may be $$H_d(x,t) = (1-t)(F_A(x) + a) + tF_B(x) = 0 \quad (9)$$

Actually, the homotopy of equation (9) presents a small problem because, in accordance with the principles of our invention, the randomizing vector a needs to be included to avoid bifurcations. Yet, the presence of this randomizing element disturbs the operating point at t=0 which was saved for the original circuit! In other words, at t=0, $F_A(x) + a$ is no longer at the dc operating state $x_A$. The way around this is to bring the randomization element into the picture only for t strictly between 0 and 1. One way to do this is to multiply x−a by $\sigma(t)$, where $\sigma$ is any smooth function which is zero at both points t=0 and t=1, and positive elsewhere. Thus the randomization element is effectively detached at the beginning and end of the sweep. Practical choices for $\sigma(t)$ include $\sin(t\pi)$ and $t-t^2$. In other words, the homotopy of equation (9) may be transformed to, for example, $$H_d(x,t) = (1-t)F_A(x) + tF_B(x + \sigma(t)(x-a)) \quad (10)$$

Figure 5:
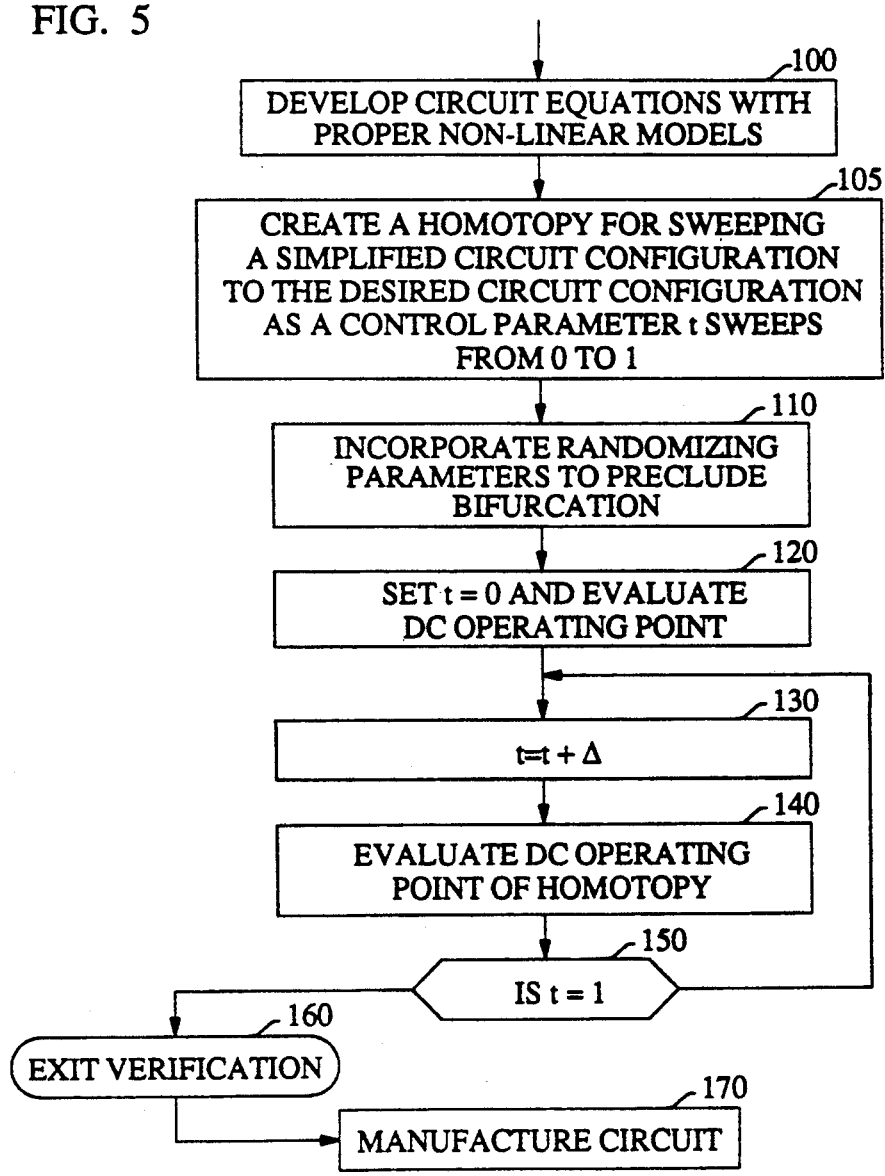
FIG. 5 presents a flow chart of the dc operating point determination process employing the principles of this invention.

FIG. 5 presents a flow diagram that characterizes our invention. In block 100, a circuit description is constructed that represents the circuit under consideration with models for the non-linear components that are passive and well behaved (in the senses described above). In block 105, a homotopy is created for sweeping a circuit configuration from a configuration whose dc operating point is either known or easily obtained to the configurations of the desired circuit. The sweeping is done through changes in a control parameter, t, whose normalized values sweep between 0 and 1. In block 110, a randomizing set of parameters are incorporated into the homotopy of block 110, to insure that bifurcations do not occur. Most typically, a randomizing factor is associated with each node equation that describes the circuit configuration of the desired circuit. It can be shown that the number of randomizing parameters need not be equal to the number of equations, as long as certain criteria are satisfied. However, most often it is easier to simply include a randomizing element with each of the equations.

In blocks 120-150, the actual sweeping is performed. In block 120, the control parameter t is set to 0 and the dc operating point of the "simplified" circuits is evaluated, if it is not already known. The homotopy guarantees a "simple" circuit at t=0 for which robust solution methods are available.

In block 130, t is incremented by a selected small step, and in block 140, a new dc operating point is evaluated with the aid of one of the conventional methods. When the step size $\delta$ is small, the unknown dc operating point is within the region of convergence of the known operating point.

At this point, block 150 determines whether t has reached the final value or not. While t is not equal to 1, control returns to block 130. When t is equal to 1, the process terminates at block 160.

Once t reaches 1 and the process terminates, the dc operating point of the circuit under consideration is a variable. At that point other analysis steps may be undertaken, such as analyzing step response, dynamic range, bandwidth of the circuit, etc. When all of the analyses are completed, the result is a circuit design in which the designer has a high level of confidence. That design is then "executed" by manufacturing integrated circuits in accordance with that design. With the additional optional analyses and the executing of the design being quite conventional, FIG. 5 lumps them all in block 170.

The above-detailed description presents the concepts of our invention and illustrative homotopies. It should be understood, however, that variation may be introduced without departing from the spirit and scope of this invention. By way of example, while the above deals with Kirchoff's current expressions of a circuit, it is well known that the voltage expressions of a circuit have a similar form and can be used similarly. Indeed, a combination of current and voltage expressions can be employed.

We claim:

1. A method for determining the dc operating state of a circuit that has a specified configuration, comprising the steps of:

modifying said circuit to create a modified circuit configuration which, 1) in response to a control parameter having a first level, modifies the configuration of said circuit and injects a randomizing current into at least some nodes of the circuit, to allow for a simplified determination of a first dc operating state, 2) in response to said control parameter having a second level, restores said circuit to its specified configuration, to allow determination of said dc operating state of said circuit, and 3) in response to other levels of said control parameter, allows the determination of other dc operating states that, together, form a trajectory of dc operating states;

setting said control parameter to said first level and evaluating said first dc operating state;

determining a dc operating state of said modified circuit configuration, at the set level of said control parameter;

altering said control parameter in the direction of advancing along said trajectory; and returning to said step of determining.

2. The method of claim 1 wherein said step of determining evaluates said dc operating state of said modified circuit with the aid of a rate of change measure of the dc operating state with respect to changes in said trajectory.

3. The method of claim 1 wherein said step of altering increases the path traversed along said trajectory.

4. The method of claim 1 wherein said step of returning returns to said step of determining as long as said control parameter does not surpass said second level.

5. The method of claim 1 wherein said step of returning returns to said step of determining as long as said control parameter does not surpass said second level by more than a selected value.

6. The method of claim 1 wherein said step of modifying creates a modified circuit configuration that corresponds to a circuit whose dc operating point is known when said control parameter is at said first value.

7. The method of claim 1 wherein said step of evaluating the dc operating state of said modified circuit configuration, when said control parameter is at other than said first level, employs the last-evaluated dc operating state of said modified circuit configuration and the last-determined rate of change in said dc operating state of said modified circuit configuration.

8. The method of claim 1 wherein said step of modifying creates a modified circuit configuration that, when said control parameter is at a value between said first level and said second level, partially nullifies nonlinearities of said circuit and injects a diminished randomizing current into each node of the circuit.

9. The method of claim 8 wherein said modified circuit satisfies the condition $(1-t)F_A(x) + F_B(x) + \sigma(t)(x-a)$, where $\sigma(t)$ is zero at $t=1$ and at $t=1$.

10. The method of claim 8 wherein said modified circuit satisfies the condition $(1-t)F_A(x) + F_B(tx) + \sigma(t)(x-a)$, where $\sigma(t)$ is zero at $t=1$ and at $t=1$.

11. The method of claim 8 wherein said step of modifying creates a modified circuit configuration that, while injecting a randomizing current into at least some nodes of said circuit, nullifies the nonlinearities of nonlinear devices in said specified circuit configuration when said control parameter is at said first level; and removes the randomizing currents and reinstates the nonlinearities of said nonlinear devices when said control parameter is at said second level.

12. The method of claim 8 wherein said step of modifying creates a modified circuit configuration that reduces to zero the gain factors of nonlinear devices that have a gain factor in said specified circuit configuration when said control parameter is at said first level and reinstates the gain factors of said nonlinear devices when said control parameter is at said second level.

13. The method of claim 12 where in the set of gain factors, $\alpha$, in said specified circuit is reflected in a set of gain factors, $t\alpha$, in said modified circuit configuration, where t is a normalized measure of said control parameter that yields the value 0 for said first level of t and the value 1 for said second level of t.

14. The method of claim 8 wherein said step of modifying creates a modified circuit configuration that develops a dc operating state which satisfies the condition $(1-t)(Bx+a) + tF(x) = 0$ where t is a normalized measure of said control parameter that yields the value 0 for said first level of t and the value 1 for said second level of t, x is the set of node voltages of said circuit, a a vector that represents a selected set of constant voltages that introduce a randomization, B is a matrix that represents another selected set of constants, and $F(x)=0$ describes the relationships that are satisfied by the dc operating state of the specified circuit.

15. The method of claim 14 wherein B is the identity matrix.

16. The method of claim 14 wherein a is zero.

17. The method of claim 8 wherein said step of modifying creates a modified circuit configuration that develops a dc operating state which satisfies the condition $(1-t)(Bx+a) + F(tx) = 0$ where t is a normalized measure of said control parameter that yields the value 0 for said first level of t and the value 1 for said second level of t, x is the set of node voltages of said circuit, a a vector that represents a selected set of constant voltages that introduce a randomization, B is a matrix that represents another selected set of constants, and $F(x)=0$ describes the relationships that are satisfied by the dc operating state of the specified circuit.

18. The method of claim 17 wherein B is the identity matrix.

19. The method of claim 17 wherein a is zero.

20. A simulation method executed by a computer for simulating the operation of a circuit comprising the steps of:

forming in a computer a circuit design of said circuit with a set of equations, $F(x)=0$ which corresponds to $F_1(x)=0, F_2(x)=0, F_3(x)=0 \ldots F_i(x)=0$ where each $F(x)=0$ represents the current relationship at node i of the circuit, x is the set of node voltages of the circuit, and $F(x)$ represents the function that relates the node voltages to the currents at node i, with that function accepting nonlinearities that have a defined and continuous first and second derivative at all values of interest of the voltages x, developing in a computer a representation of a modified circuit design that includes a normalized control parameter, t, $G(x,t) = G_1(x,t) + G_2(x,t)$, where $F_2(x,1) = F(x)$ and where $G_1(x,0)$ is a modified representation of said circuit that allows for simplified determination of voltages x that satisfy the relationship $G_1(x,0,a) = 0$ and where a is a set of randomizing parameters that are selected to prevent bifurcation points in the trajectory of dc operating point of the modified circuit as a function of the control parameter, t;

setting said control parameter to 0 and evaluating the dc operating state of said modified circuit, corresponding to $G(x,1)=0$;

modifying said control parameter by a step size of preselected magnitude, in a direction of transforming said modified circuit to its original configuration, $F(x)$;

determining the dc operating point of said modified circuit;

returning to said step of modifying said control parameter at least as long as said control parameter has not reached the level 1; and outputting said circuit design when the control parameter has reached the level 1.

21. A method for manufacturing a circuit comprising the steps of:

creating a design of said circuit;

verifying said design of the circuit against a selected set of criteria to form a verified circuit design; and manufacturing the circuit in accordance with said verified circuit design, wherein said step of verifying said design of the circuit includes the steps of forming a circuit description of said circuit with a set of equations, $F(x)=0$ which corresponds to $F_1(x)=0$, $F_2(x)=0$, $F_3(x)=0 \ldots F_i(x)=0$ where each $F(x)=0$ represents the current relationship at node i of the circuit, x is the set of node voltages of the circuit, and $F(x)$ represents the function that relates the node voltages to the currents at node i, with that function accepting nonlinearities that have a defined and continuous first and second derivative at all values of interest of the voltages x, developing a representation of a modified circuit that includes a normalized control parameter, t, $G(x,t,a)=G_1(x,t,a)+G_2(x,t)$, where $G_2(x,1)=F(x)$ and where $G_1(x,0,a)$ is a modified representation of said circuit that allows for simplified determination of voltages x that satisfy the relationship $F_1(x,0,a)=0$ and where a is a set of randomizing parameters that are selected to prevent bifurcation points in the trajectory of dc operating point of the modified circuit as a function of the control parameter, t;

setting said control parameter to 0 and evaluating the dc operating state of said modified circuit, corresponding to $G(x,t)=0$;

modifying said control parameter by a step size of preselected magnitude, in a direction of transforming said modified circuit to its original configuration, $F(x)$;

determining the dc operating point of said modified circuit; and returning to said step of modifying said control parameter at least as long as said control parameter has not reached the level 1.

* * * * *

UNITED STATES PATENT AND TRADEMARK OFFICE
CERTIFICATE OF CORRECTION

PATENT NO. : 5,181,179
DATED : January 19, 1993
INVENTOR(S) : San-Chin Fang, Robert C. Melville, and Ljiljana Trajkovic It is certified that error appears in the above-indentified patent and that said Letters Patent is hereby corrected as shown below:

On the Title page, item [75] inventor's last name Trajkovi, should be Trajkovic--

Signed and Sealed this

Twenty-second Day of February, 1994

Attest:

BRUCE LEHMAN

Attesting Officer          Commissioner of Patents and Trademarks